US011239197B2

(12) United States Patent
Song et al.

(10) Patent No.: US 11,239,197 B2
(45) Date of Patent: Feb. 1, 2022

(54) WIRE BONDING APPARATUS THREADING SYSTEM

(71) Applicant: ASM Technology Singapore Pte Ltd, Singapore (SG)

(72) Inventors: Keng Yew Song, Singapore (SG); Yue Zhang, Singapore (SG); Xiao Liang Chen, Singapore (SG); Yao Tong, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 131 days.

(21) Appl. No.: 16/697,513

(22) Filed: Nov. 27, 2019

(65) Prior Publication Data

US 2021/0159205 A1 May 27, 2021

(51) Int. Cl.
*B23K 20/00* (2006.01)
*H01L 23/00* (2006.01)
*B23K 101/40* (2006.01)

(52) U.S. Cl.
CPC ............ *H01L 24/78* (2013.01); *B23K 20/007* (2013.01); *B23K 2101/40* (2018.08); *H01L 2224/78611* (2013.01)

(58) Field of Classification Search
CPC ....... H01L 2924/00; H01L 2224/85205; H01L 2224/78301; H01L 24/78; H01L 2224/78343; H01L 2224/78353; H01L 2224/78611; H01L 2224/789; B23K 20/004; B23K 20/007; B23K 20/10; B23K 20/005
See application file for complete search history.

(56) References Cited

U.S. PATENT DOCUMENTS

| 9,793,236 B2 * | 10/2017 | Sekine | B23K 20/005 |
| 10,896,892 B2 * | 1/2021 | Momose | H01L 24/85 |
| 2008/0093416 A1 * | 4/2008 | Utano | B23K 20/004 228/1.1 |
| 2008/0197168 A1 * | 8/2008 | Horino | H01L 24/85 228/8 |
| 2011/0049219 A1 * | 3/2011 | Huang | B23K 20/007 228/42 |
| 2011/0114704 A1 * | 5/2011 | Sugawara | B23K 20/007 228/102 |

* cited by examiner

*Primary Examiner* — Erin B Saad
(74) *Attorney, Agent, or Firm* — Ostrolenk Faber LLP (57) ABSTRACT

A method for automatically threading wire in a wire bonding apparatus includes the steps of extending a wire tail of a wire from a wire spool, locating the wire tail in a wire locating device and positioning the wire tail at a straightening location of the wire locating device. The wire tail is straightened at the straightening location with a wire manipulating device and then conveyed to a threading location. With a wire threading device, the straightened wire tail is received at the threading location and is threaded through a capillary of the wire bonding apparatus.

23 Claims, 12 Drawing Sheets

WIRE BONDING APPARATUS THREADING SYSTEM

FIELD OF THE INVENTION

The invention relates to a threading system for a wire bonding apparatus, and in particular to a method and apparatus for automatic wire threading in a wire bonding apparatus.

Background

In a wire bonding process, electrically conductive wires are typically bonded between electrical bonding pads found on electronic devices, such as between a semiconductor die and a substrate onto which the die is attached. The substrate is usually a semiconductor lead frame. The electrical connection could also be made between bonding pads found on separate semiconductor dice. The bond is formed by a bonding tool which may be in the form of a capillary attached to an ultrasonic transducer for generating ultrasonic energy to a tip of the capillary.

In wire bonders for making so-called "ball bonds", a bond head which carries the bonding tool is designed to execute a rocking motion about a suitably located pivot. For ultrasonic bonding, an ultrasonic transducer is mounted onto the bond head, the ultrasonic transducer comprising a piezoelectric driver stack coupled to a horn, and a bonding tool in the form of a capillary at an end of the horn. Bonding wire, which is typically made of gold, aluminum or copper, is fed from a spool of bonding wire through a hole in the capillary to the tip of the capillary. Bonding is done by welding the wire at the tip of the capillary to the bonding pad through the application of ultrasonic energy and force to the capillary tip.

The bonding wire needs to be threaded from the spool, through any intermediate equipment, and through the capillary each time the spool is replaced or whenever the bonding wire escapes from the capillary, which can be problematic.

It would be beneficial to provide an improved technique for threading the bonding wire as compared to the prior art.

SUMMARY OF THE INVENTION

It is thus an object of this invention to seek to provide a technique which overcomes at least some of the aforementioned problems of the prior art.

According to a first aspect of the present invention, there is provided a method for automatically threading wire in a wire bonding apparatus, comprising the steps of: extending a wire tail of a wire from a wire spool and locating the wire tail in a wire locating device; positioning the wire tail at a straightening location of the wire locating device; straightening the wire tail at the straightening location with a wire manipulating device and conveying the straightened wire tail to a threading location; and with a wire threading device, receiving the straightened wire tail at the threading location and threading the straightened wire tail through a capillary of the wire bonding apparatus.

Providing a straightened wire tail at the straightening location and conveying the straightened wire tail to a threading location enables automatic threading of the capillary of the wire bonding apparatus without requiring intervention by a human operator.

The wire locating device may define a positioning aperture shaped to receive and guide the wire tail to the wire straightening location.

The positioning aperture may be defined by a pair of converging opposing faces which converge at a positioning face at the straightening location.

The positioning face may extend along a vertical direction to orientate the wire tail along the vertical direction.

The step of positioning the wire tail at the straightening location may further comprise urging the wire tail which extends through the positioning aperture towards the positioning face with a wire tail urging device incorporated in the wire locating device.

The wire tail urging device may comprise an airflow generator which generates an airflow to urge the wire tail extending through the positioning aperture towards the positioning face.

The airflow generator may further retain the wire tail extending through the positioning aperture against the positioning face.

The step of straightening the wire tail at the straightening location may comprise gripping the wire tail with respective first and second pairs of wire holders next to the straightening location.

The step of straightening the wire tail may further comprise the step of moving at least one of the first and second pair of wire holders away from the other while gripping the wire tail to straighten at least a portion of the wire tail.

The method may further comprise the step of cutting excess wire from a free end of the wire tail to leave the straightened wire tail.

The step of receiving the straightened wire tail at the threading location may further comprise pulling the straightened wire tail to the threading location with at least one of the first and second pair of wire holders.

The method may further comprise the step of inducing a tension in the wire via an air tensioner while pulling the straightened wire tail to the threading location.

The step of threading the straightened wire tail through the capillary may further comprise the step of moving the wire threading device from a parked position to the threading location which is aligned with the capillary.

The method may further comprise the step of guiding the straightened wire tail with at least one wire guide comprised in the wire threading device towards the capillary.

The wire guide may comprise a slotted guiding channel having an elongate slot extending along its axial length aligned with the air tensioner and the capillary.

The wire guide may comprise a slot restrictor operative in use to close the slot.

The slot restrictor may comprise a flexible cover operative in use to move between a closed and an open position to close and open the slot.

The method may further comprise the step of generating an airflow within the wire guide to move the flexible cover between the closed and open positions.

The slot restrictor may comprise a spring coupling a first half of the wire guide with a second half of the wire guide and operative in use to move between a closed and an open position to close and open the slot.

The method may further comprise the step of obtaining information regarding a location of the wire guide with respect to the capillary by imaging a positioning identifier coupled to the wire threading device.

The positioning identifier may comprise a visual index operative in use to be imaged by a wire bonding imaging device.

The method may further comprise the step of aligning the wire guide with the capillary by positioning the wire guide with a motion table and controller.

According to a second aspect of the present invention, there is provided a wire bonding threading apparatus configured to perform the method according to the first aspect of the present invention.

According to a third aspect of the present invention, there is provided a wire bonding threading apparatus, comprising: a wire locating device operative in use to receive a wire tail from a wire spool and to position the wire tail at a straightening location; a wire manipulating device operative in use to straighten the wire tail at the straightening location and to convey the straightened wire tail to a threading location; and a wire threading device operative in use to receive the straightened wire tail at the threading location and to thread the straightened wire tail through a capillary of a wire bonding apparatus.

The wire locating device may define a positioning aperture shaped to receive the wire tail from the wire spool.

The positioning aperture may be defined by a pair of converging opposing faces which converge at a positioning face at the straightening location.

The positioning face may extends along a vertical axis to orientate the wire tail along the vertical axis.

The wire locating device may comprise a wire tail urging device operative in use to urge the wire tail extending within the positioning aperture towards a positioning face located at the straightening location.

The wire tail urging device may comprise an airflow generator operative in use to generate an airflow to urge the wire tail extending within the positioning aperture towards the positioning face.

The airflow generator may be operative in use to retain the wire tail extending within the positioning aperture against the positioning face.

The wire manipulating device may comprise a first and a second pair of wire holders operative in use to grip the wire tail at the straightening location.

One of the first and second pair of wire holders may be operative in use to move apart while gripping the wire tail to straighten at least a portion of the wire tail.

One of the first and second pair of wire holders may be operative in use to move apart along the vertical axis while gripping the wire tail to straighten the wire tail along the vertical axis.

At least one of the first and second pair of wire holders may be operative in use to convey the straightened wire tail to a cutting location for cutting excess wire from a free end to leave the straightened wire tail.

At least one of the first and second pair of wire holders may be operative in use to reposition the straightened wire tail to the threading location.

At least one of the first and second pair of wire holders may be operative in use to reposition the straightened wire tail to the threading location via an air tensioner.

The wire threading device may be operative in use to move from a parked position to the threading location aligned with the capillary.

The wire threading device may comprise at least one wire guide operative in use to guide the straightened wire tail along the vertical axis towards the capillary.

The wire guide may comprise a slotted guiding channel having an elongate slot extending along its axial length aligned with the vertical axis.

The wire guide may comprise a slot restrictor operative in use to close the slot.

The slot restrictor may comprise a flexible cover operative in use to move between a closed and an open position to close and open the slot.

The flexible cover may be moved between the closed and open position by an airflow within the wire guide.

The slot restrictor may comprise a spring coupling a first half of the wire guide with a second half of the wire guide and operative in use to move between a closed and an open position to close and open the slot.

The wire threading device may comprise positioning identifier operative in use to provide information regarding a center-line of the wire guide with respect to the capillary.

The positioning identifier may comprise a visual index operative in use to be imaged by a wire bonding imaging device.

The wire threading device may comprise a motion table and controller operative in use to align the center-line of the wire guide with a center-line of the capillary.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which:

FIG. 4A to 4G illustrate the main steps performed by a wire manipulating device in conjunction with the horizontal guiding apparatus; wherein

FIG. 5A to 5M illustrate the arrangement and operation of a wire bond threading apparatus, according to one embodiment, wherein

In the drawings, like parts are denoted by like reference numerals.

DETAILED DESCRIPTION

Before discussing embodiments in any more detail, first an overview will be provided. The embodiments of the invention provide a technique for threading a bonding wire in a wire bonding apparatus automatically. A number of components are used to perform such threading. A wire locating device captures and positions the wire tail of the bonding wire so that it may be straightened and then threaded through a threading device which threads the straightened wire tail through a capillary of a wire bonding apparatus. This provides for predictable, reliable and automated threading of the wire bonding apparatus, which improves throughput and reduces downtime. In particular, some embodiments seek to perform threading from a wire spool, typically through an air path air tensioner, through one or more wire clamps and through a capillary of the wire bonding apparatus to enable the capillary to prepare the required wire tail, to enable bonding production to continue. Some embodiments provide three main features which help to direct the wire from the wire spool to the capillary, and these are an automatic wire locating device, an automatic wire straightening and transporting device and an automatic threading device. With these devices, no operator needs to attend to the machine or perform manual threading after a wire spool is replaced or when a bonding wire escapes from the capillary during production. Hence, embodiments can help the wire bonding machine to minimize machine downtime during production and require far fewer or even no operators to attend the bonder on the production floor. This helps to improve the mean time between assists, an important criterion of wire bonding. In particular, an automatic wire threading apparatus is a vital part for wire bonders to enable no operator attendance during production over a number of days or an even longer period.

Automatic Threading

Figure 1:
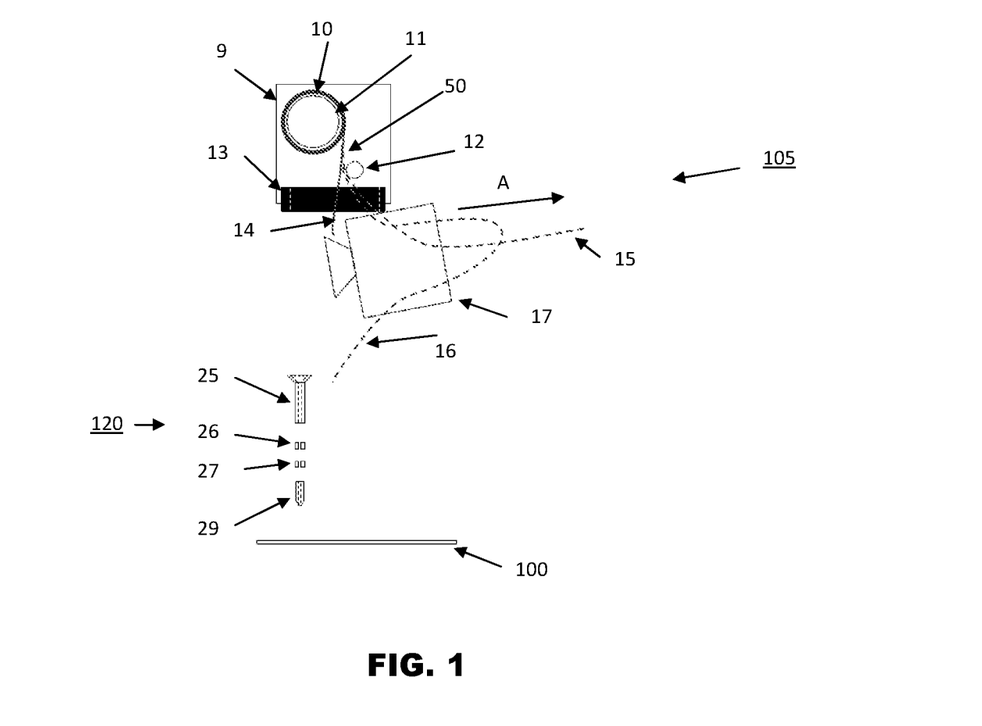
FIG. 1 illustrates schematically the major components of an automatic wire bonding apparatus.

FIG. 1 illustrates schematically the major components of an automatic wire bonding apparatus 105. The automatic wire bonding apparatus 105 comprises a wire bonding threading apparatus 110 (see FIG. 2) which automatically threads a wire bonding apparatus 120.

Wire Bonding Apparatus

The wire bonding apparatus 120 comprises a wire spool holder 9 which houses a wire spool 10, which provides bonding wire 50 having a free end forming a wire tail. The wire spool 10 is typically carried on a motorized wire spooler 11, which allows the wire spool 10 to be rotated in clockwise and/or anticlockwise directions to lengthen and/or shorten the wire tail. The wire spool holder 9 also houses a wire guiding pole 12. The wire spool holder 9 is positioned typically above a substrate 100, on which wire bonding is to occur.

Positioned between the substrate 100 and the wire spool holder 9 are further components of the wire bonding apparatus 120. In particular, a capillary 29 is provided proximate the substrate 100 and an air tensioner body 25 proximate the wire spool holder 9. Between the capillary 29 and the air tensioner body 25 are first wire clamp 26 and second wire clamp 27. Located between the air tensioner body 25 and the wire spool 9 is an airpath device 17. The airpath device 17 generates an airflow in the direction A which helps to apply a slight tension to the standing part of the bonding wire 50 extending through the wire bonding apparatus 120.

There are typically two typical scenarios when auto threading of the bonding wire 50 may be required. The first is when there is a need to change the wire spool 10, typically when the existing wire spool 10 has been used up or where a different bonding wire is required to perform a new bonding program. The second is where the bonding wire 50 has escaped from the capillary 29 during bonding.

For the first scenario, the new wire spool 10 is placed on the wire spool holder 9 and the wire tail will typically be found at a first position 14, which extends generally vertically, with the tail hanging within a horizontal guiding apparatus 13 positioned in an outlet of the wire spool holder 9, with the wire tail falling from the wire spool 10 and alongside the wire guide pole 12. This may be positioned there by an operator when changing the wire spool 10 or may be positioned at the first position 14 automatically by the wire spool 10 performing a pre-set rotation to extend the wire tail to the first position 14.

In the second scenario, the wire tail may possibly be positioned at, for instance, a second position 15 or a third position 16. In the second position 15, the bonding wire 50 has completely come free from the wire bonding apparatus 120 and is flying within an airflow generated by the airpath device 17. In the third position 16, the bonding wire 50 is either partially or completely free of the wire bonding apparatus 120 but is only partially deflected by the airflow of the airpath device 17. In either event, the wire spool 10 may be rotated anticlockwise to shorten the free hanging wire tail to obtain a wire tail at the first position 14.

Wire Bonding Threading Apparatus

Figure 2:
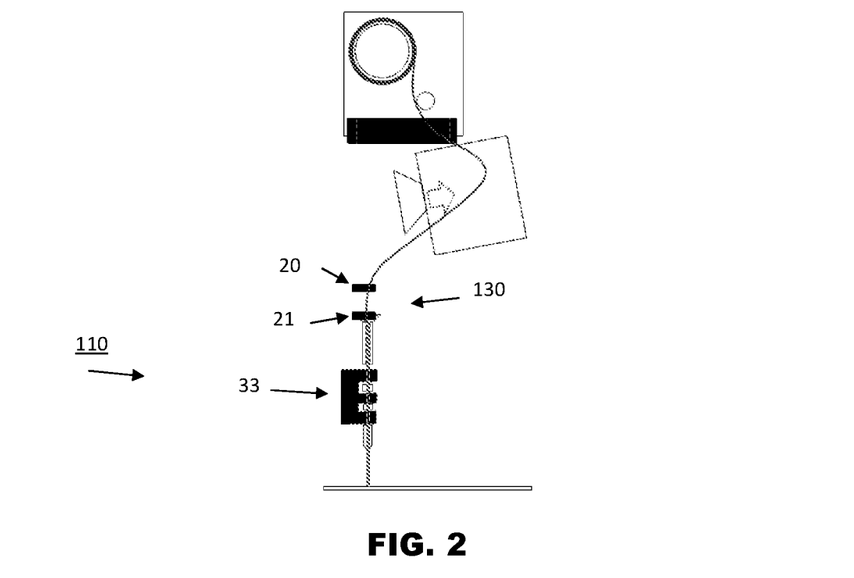
FIG. 2 illustrates schematically the major components of a wire bonding threading apparatus according to one embodiment.

FIG. 2 illustrates schematically components of the wire bonding threading apparatus 110 which thread the wire tail from the wire spool holder 9 via the airpath device 17 and through the air tensioner body 25, the first wire clamp 26, the second wire clamp 27 and capillary 29. These components comprise the horizontal guiding apparatus 13, an upper wire carrier 20 located proximate the horizontal guiding apparatus 13 and a lower wire carrier 21 located distal from the horizontal guiding apparatus 13. A wire threading device 33 is positionable to be co-located to interleave between the air tensioner body 25, the first wire clamp 26, the second wire clamp 27 and the capillary 29. As will be mentioned in more detail below, the horizontal guiding apparatus 13 cooperates with an upper wire carrier 20, lower wire carrier 21 and the wire threading device 33 to automatically thread the wire tail 50 via the airpath device 17, and through the air tensioner body 25, first wire clamp 26, second wire clamp 27 and capillary 29.

Horizontal Guiding Apparatus

Figure 3A:
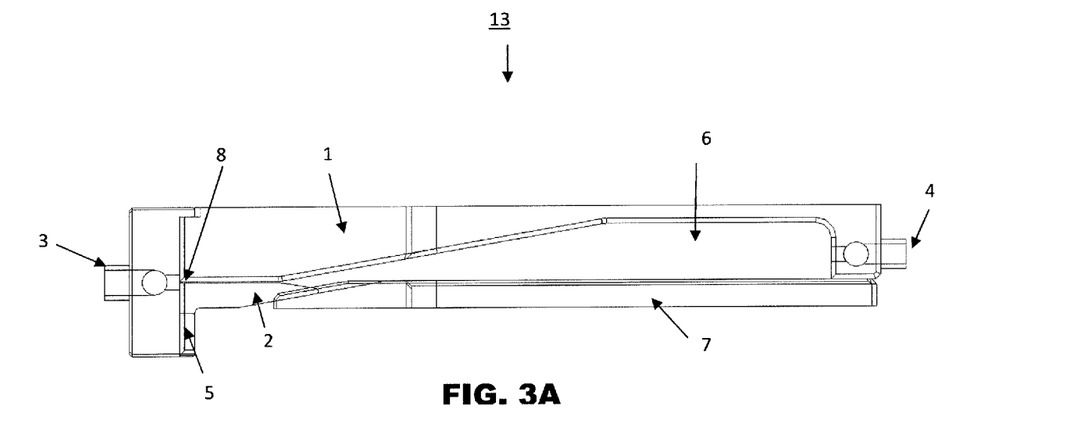
FIG. 3A shows top view of a horizontal guiding apparatus according to one embodiment.
Figure 3B:
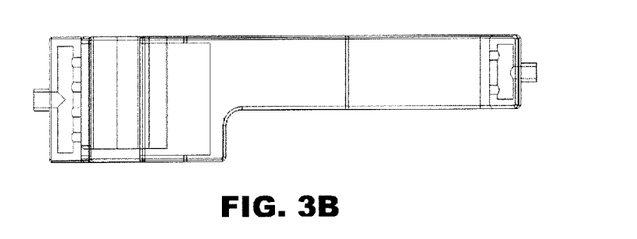
FIG. 3B shows a side view of a horizontal guiding apparatus according to one embodiment.
Figure 3C:
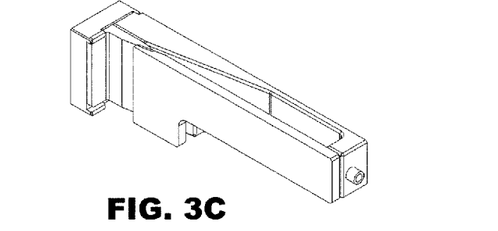
FIG. 3C shows a perspective view of a horizontal guiding apparatus according to one embodiment.

FIG. 3A shows the top, FIG. 3B shows the side and FIG. 3C shows a perspective view of the horizontal guiding apparatus 13 according to one embodiment. The horizontal guiding apparatus 3 is positioned below the wire spool 10 and above the airpath device 17. The horizontal guiding apparatus 13 comprises a rear guiding block 1 and a front guiding block 2, together with a door 7, which defines a tapering or narrowing cavity 6. An air blowing channel 4 is located towards a first end of the cavity 6 and an air suction channel 3 is located towards a second end of the cavity 6. The cavity 6 is wider towards the air blowing channel 14 and narrower towards the air suction channel 3. The cavity 6 terminates at a locating plane 5, which defines a target location 8. The airflow can be adjusted for different sizes of bonding wire 50 and the inner faces defining the cavity 6 allow for free movement of the bonding wire 50 without affecting the bonding wire 50 surface.

In operation, the wire tail enters the cavity 6 at its widest part, which aligns with the first position 14. Air is introduced via the air blowing channel 4 and exhausted via the air suction channel 3. This causes the wire entrained by the airflow between the air blowing channel 4 and the air suction channel 3 to move away from the air blowing channel 4 and towards the air suction channel 3. The wire is then guided by the rear guiding block 1, the door 7 and/or the front guiding block 2 through the narrowing cavity 6 until it reaches the target location 8, where it is held by the airflow. The suction force generated by the air suction channel 3 also aids in retaining the wire tail against the locating position 8. The end result achieved is to produce a wire tail hanging vertically from the locating position 8, so as to prepare for transportation by a wire manipulating device 130. Hence, it can be seen that the horizontal guiding apparatus 3 is designed to automatically retrieve and locate the wire tail to the target location 8 for the next device to process and then accurately transfer the wire tail for threading.

Wire Manipulating Device

Figure 4A:
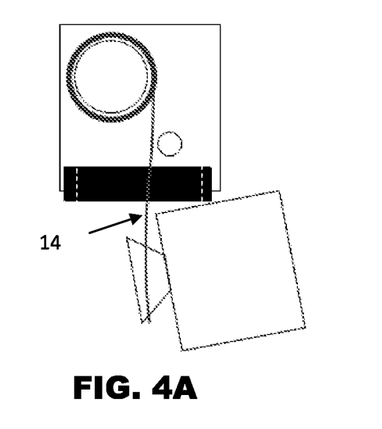
FIG. 4A illustrates a first step.

FIGS. 4A to 4G illustrate the main steps performed by the wire manipulating device 130 in conjunction with the horizontal guiding apparatus 13. As shown in FIG. 4A, the wire bonding threading apparatus 110 is triggered when it is detected there is a need to perform automatic threading, typically due to one of the scenarios mentioned above. Accordingly, the wire spool 10 is rotated and the wire tail is left extending through the horizontal guiding apparatus 13 at the first position 14.

Figure 4B:
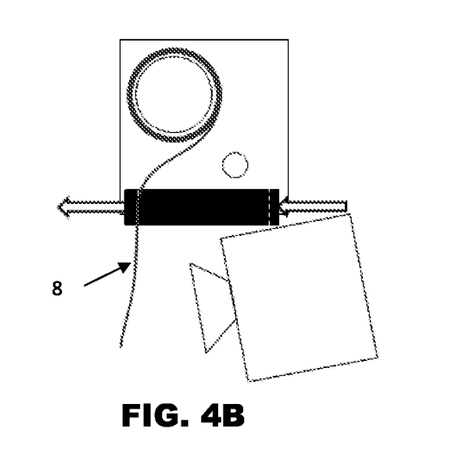
FIG. 4B illustrates a second step.

As shown in FIG. 4B, the horizontal guiding apparatus 13 is activated and the airflow urges the wire tail 50 to the target location 8.

The wire manipulating device 130 comprises the upper wire carrier 20, the lower wire carrier 21 and their driving systems. The upper wire carrier 20 and the lower wire carrier 21 are controlled individually or collectively in X, Y and Z directions. Each carrier, 20, 21 has a pair of damper plates to hold the wire and one or more guiding parts to constrain the wire location. As will be explained in more detail below, the wire manipulating device 130 operates generally to capture the wire tail at the target location 8, to move the upper wire carrier 20 and the lower wire carrier 21 apart to stretch the wire to cause strain hardening within that section of the bond wire 50, to cut and transfer a free end of the wire tail for disposal at a disposal position, to guide the remaining wire tail towards an opening of the air tensioner body 25 and/or to direct the wire tail into the air tensioner body 25.

Figure 4C:
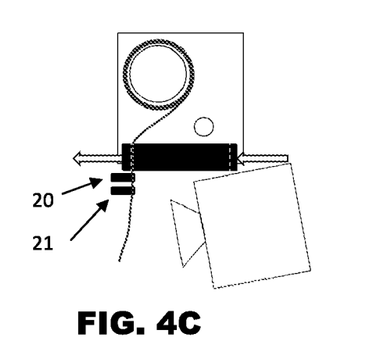
FIG. 4C illustrates a third step.

Accordingly, as shown in FIG. 4C, the upper wire carrier 20 and lower wire carrier 21 move to a position below the target location 8 and grip the wire tail.

Figure 4D:
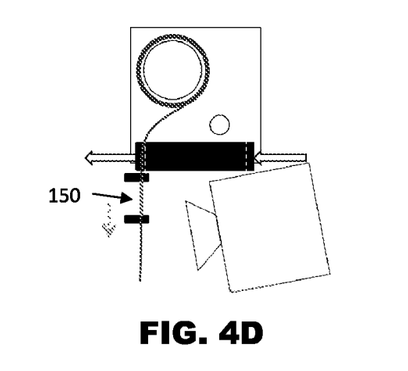
FIG. 4D illustrates a fourth step.

Then, as shown in FIG. 4D, the upper wire carrier 20 and the lower wire carrier 21 move apart in order to stretch and strain-harden a section 150 of the bonding wire 50.

Figure 4E:
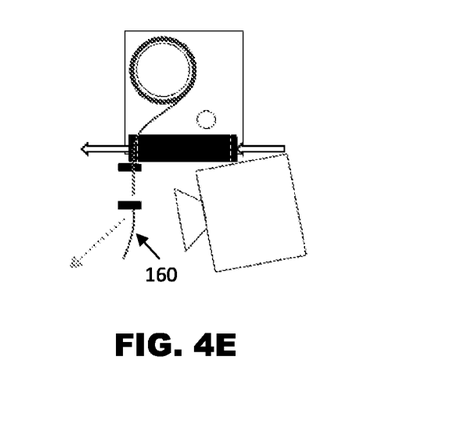
FIG. 4E illustrates a fifth step.

As shown in FIG. 4E, a residual section 160 of the bond wire 50, which is located towards the free end of the bond wire 50 and which is typically unstraightened is removed and transferred to a disposal location for disposal by the lower wire carrier 21. The lower wire carrier 21 then returns to clamp the free end of the section 150.

Figure 4F:
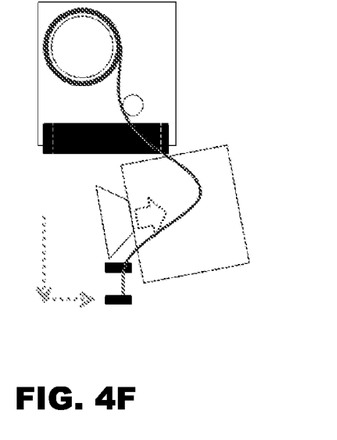
FIG. 4F illustrates a sixth step.

As shown in FIG. 4F, the upper wire carrier 20 and the lower wire carrier 21 together move to convey the portion of the wire tail between the section 150 and the wire spool 10 into the airflow of the airpath device 17.

Figure 4G:
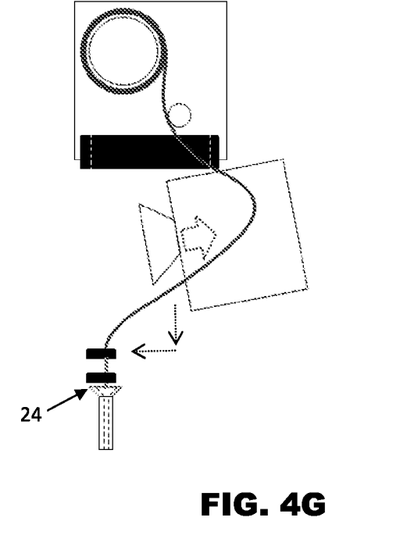
FIG. 4G illustrates a seventh step.

As shown in FIG. 4G, the upper wire carrier 20 and lower wire carrier 21 together move the wire section 150 to an air tensioner opening 24 of the air tensioner body 25 positioned proximate the wire spool holder 9. The lower wire carrier 21 then loosens its grip on the section 150 and movement of the upper wire carrier 20 towards the air tensioner opening 24 causes the section 150 to be introduced into the air tensioner opening 24. The air tensioner 25 is coupled with an air source which results in an airflow through the air tensioner 25 so as to draw the section 150 into the air tensioner 25.

FIGS. 5A to 5M illustrate the arrangement and operation of a wire bond threading apparatus 100A, according to one embodiment. This arrangement is similar to the arrangement described above. In particular, there is provided a wire spool holder 9A having a wire spooler 11A driven by a motor. The wire spool holder 9A has a wire guide pole 12A and a horizontal guiding apparatus 13A. The front of the wire spool holder 9A is pivoted and receives a door 7A to the horizontal guiding apparatus 13A. A wire spool is placed on the wire spooler 11A and operated in a similar manner to the wire spool holder 9 mentioned above.

Figure 5A:
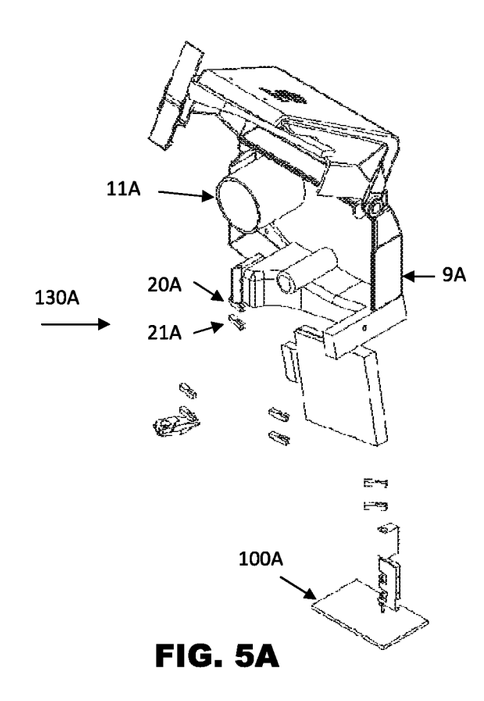

An upper wire carrier 20A and a lower wire carrier 21A together form a wire manipulating device 130A, which operates in a manner similar to the wire manipulating device 130 mentioned above.

An airpath device 17A sits below the wire spool holder 9A and operates in a similar manner to the airpath device 17 mentioned above.

An air tensioner body 25A is positioned above components of a wire bonding apparatus 120A which again operate in a similar manner to the air tension body 25 and the wire bonding apparatus 120 mentioned above.

A wire threading device 33A is movable to interleave with the wire bonding apparatus 120A in a similar manner to the wire threading device 33 mentioned above.

Wire Manipulating Device Operation

Figure 5B:
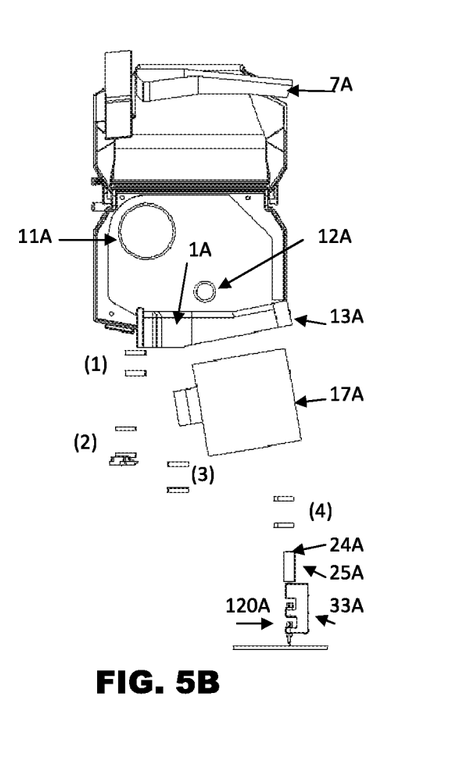
FIG. 5B illustrates features of the one embodiment.

As can be seen in FIG. 5B, the wire manipulating device 130A is movable from a first position (1) where it receives a wire tail at a target location 8A, where the tail is straightened before being moved to a second position (2), where excess wire is removed prior to being moved to a third position (3), where it interacts with the airflow generated by airpath device 17A, prior to being moved to a fourth position (4), where it is inserted into an air tensioner opening 24A of the air tensioner body 25A.

Figure 5C:
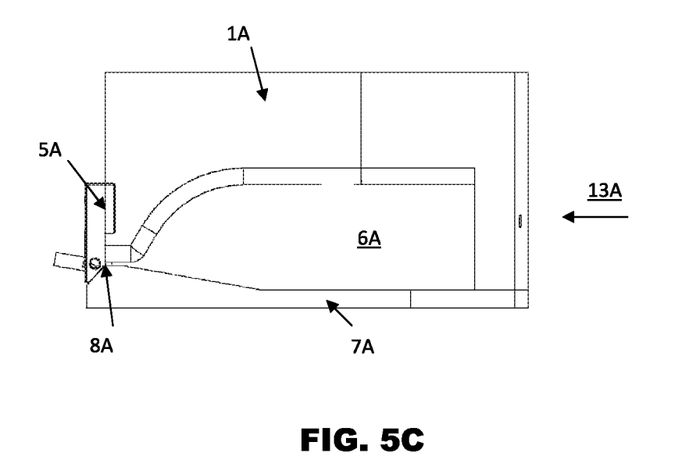
FIG. 5C illustrates further features of the one embodiment.

FIG. 5C is a schematic top-down view of the horizontal guiding apparatus 13A in more detail. As can be seen, there is provided a rear guiding block 1A and a door 7A which also acts as the front guiding block. A cavity 6A is formed therebetween, which narrows towards a target location 8A abutting against a locating plane 5A.

Figure 5D:
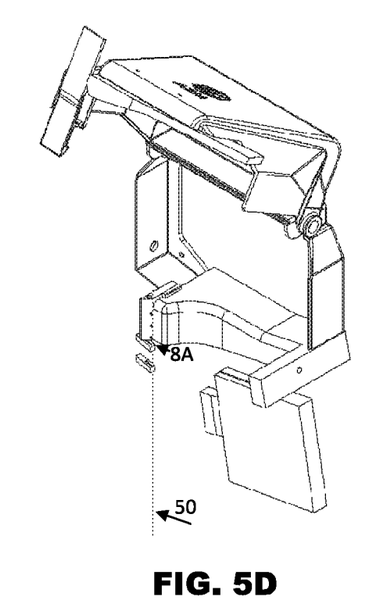
FIG. 5D illustrates further features of the one embodiment.
Figure 5E:
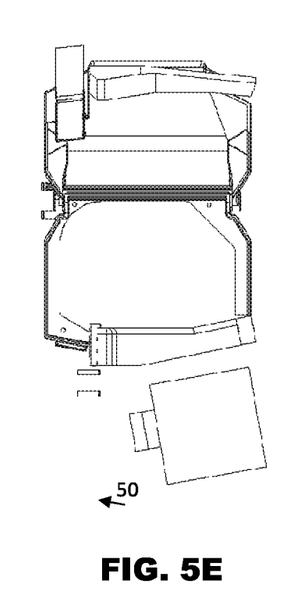
FIG. 5E illustrates further features of the one embodiment.
Figure 5F:
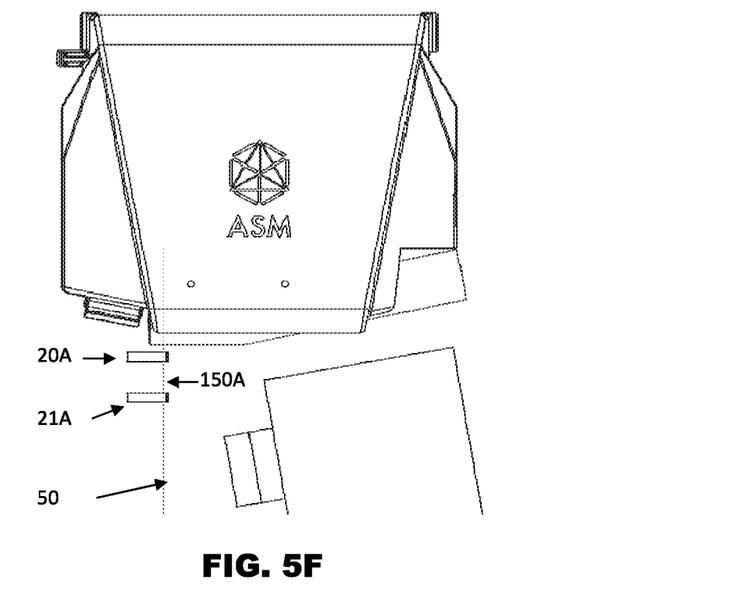
FIG. 5F illustrates further features of the one embodiment.

As shown in FIGS. 5D, 5E and 5F, the wire tail is located at the target location 8A and clamped by the upper wire carrier 20 and the lower wire carrier 21A at the first position (1). The upper wire carrier 20A and the lower wire carrier 21A move apart to stretch the wire tail and form a straightened portion 150A.

Figure 5G:
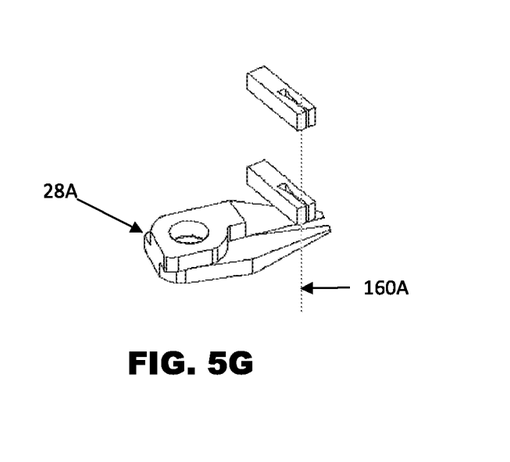
FIG. 5G illustrates further features of the one embodiment.
Figure 5H:
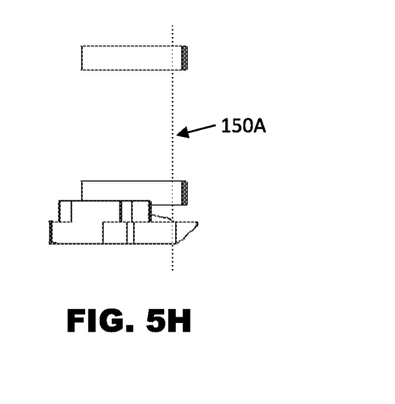
FIG. 5H illustrates further features of the one embodiment.
Figure 5I:
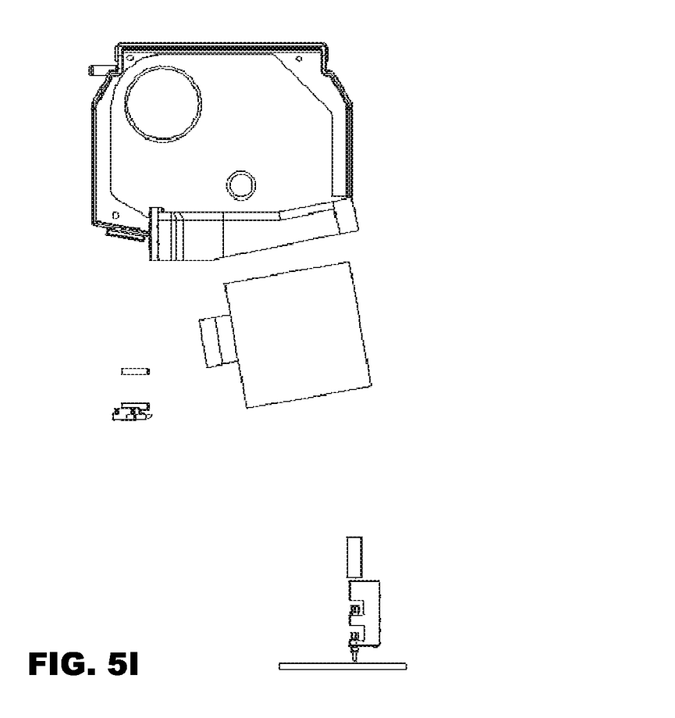
FIG. 5I illustrates further features of the one embodiment.

As shown in FIGS. 5G, 5H and 5I, the upper wire carrier 20A and the lower wire carrier 21A move to the second position (2), where a cutter 28A cuts a residual section 160A to leave the straightened section 150A.

Figure 5J:
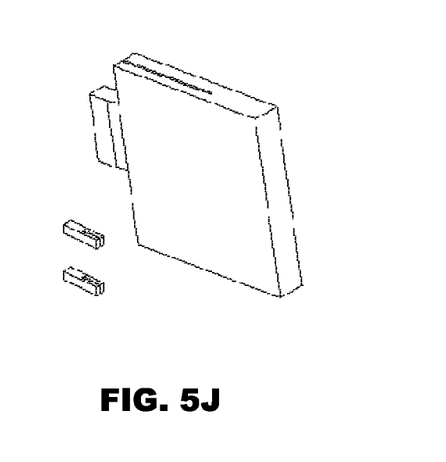
FIG. 5J illustrates further features of the one embodiment.
Figure 5K:
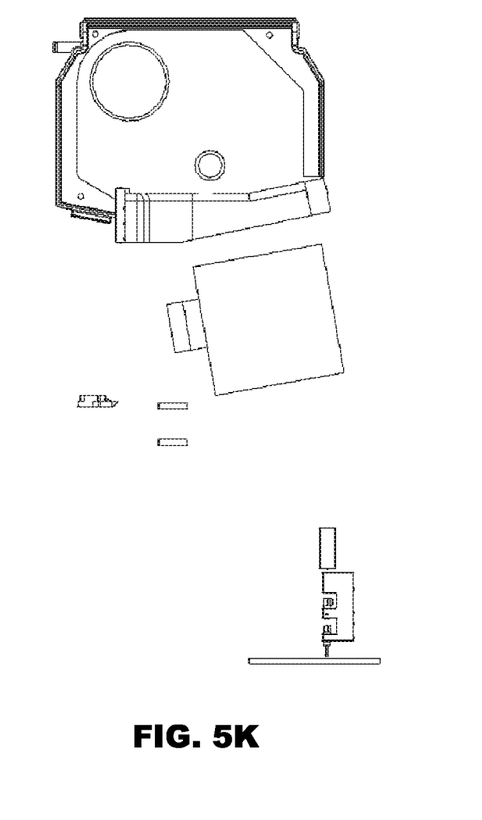
FIG. 5K illustrates further features of the one embodiment.

As shown in FIGS. 5J and 5K, the upper wire carrier 20A and the lower wire carrier 21A move to the third position (3), where the standing part of the bonding wire 50 is placed in the airflow of the airpath device 17.

Figure 5L:
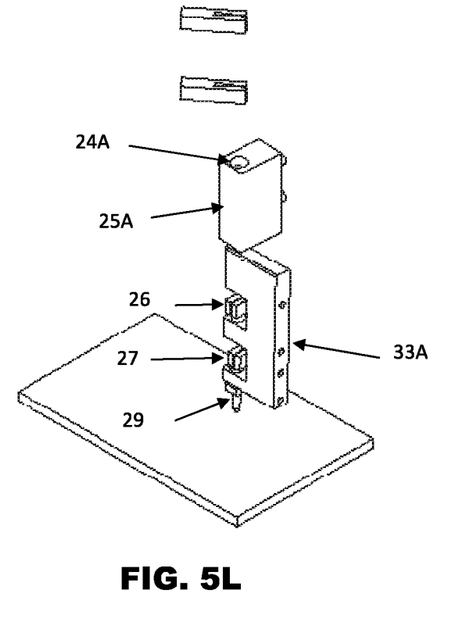
FIG. 5L illustrates further features of the one embodiment.
Figure 5M:
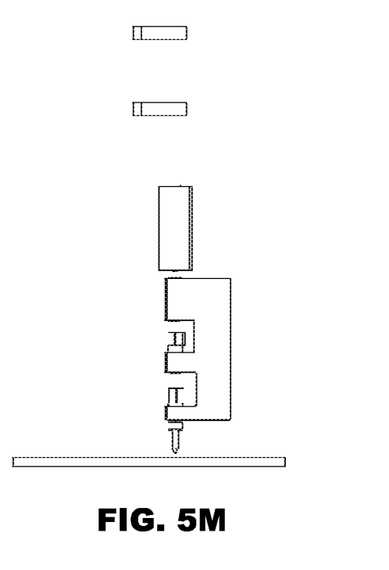
FIG. 5M illustrates further features of the one embodiment.

As shown in FIGS. 5L and 5M, the upper wire carrier 20A and the lower wire carrier 21A move the section 150 to the fourth position (4), over the air tensioner opening 24A.

Wire Threading Device

Figure 6:
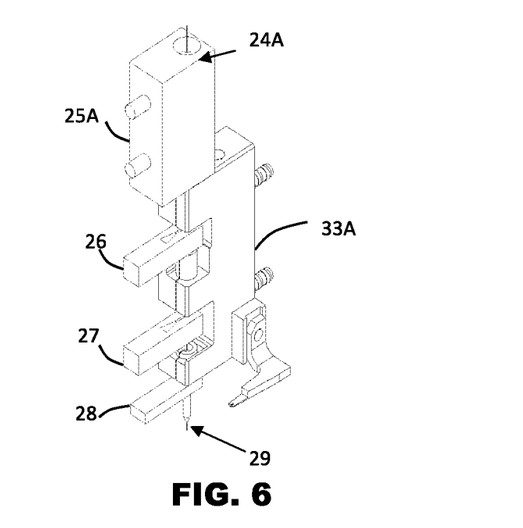
FIG. 6 illustrates guides of the wire threading device coaxially aligned with the air tensioner opening and the aperture within the capillary.

As shown in FIG. 6, guides of the wire threading device 33A are coaxially aligned with the air tensioner opening 24A and the aperture within the capillary 29, as will be explained in more detail below. This enables the section 150A to be threaded into the air tensioner opening 24A, through the air tensioner body 25A, through the first wire clamp 26, the second wire clamp 27 and into the capillary 29.

Figure 7A:
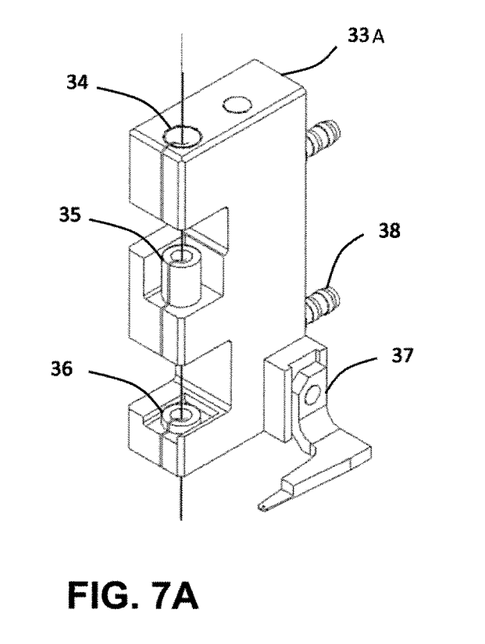
FIG. 7A is a perspective view of the wire threading device.
Figure 7B:
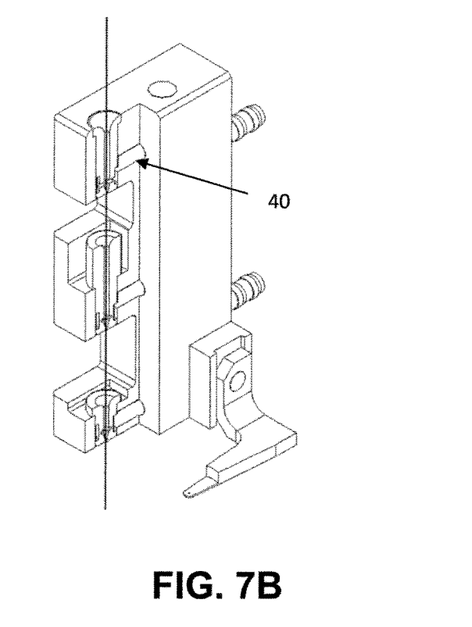
FIG. 7B is a partial sectional view through the wire threading device.

FIG. 7A is a perspective view of the wire threading device 33A and FIG. 7B is a partial sectional view through the wire threading device 33A. The wire threading device 33A continues the threading process from the wire manipulating device 130A, where the section 150A has entered the air tensioner body 25A. After the section 150A exits from the air tensioner body 25A, the wire threading device 33A aims to guide the section 150A through the subsequent wire clamps 26, 27 and the capillary 29. When the section 150A goes through the capillary 29, it is detected and allowed to continue in order that any contaminated wire can be removed prior to commencing production operations. Once the threading has been completed, then the wire manipulating device 130A and the wire threading device 33A are retracted to a home position and production may commence or continue.

As can be seen in FIGS. 7A and 7B, the wire threading device 33A has a first guiding insert 34 in the form of a narrowing or tapering inlet channel proximate an outlet of the air tensioner body 25A. The first guiding insert 34 extends towards a second guiding insert 35, which is also a narrowing or tapering inlet channel proximate an outlet of the first guiding insert 34. A third guiding insert 36 is also a narrowing or tapering inlet channel which is proximate an outlet of the second guiding insert 35. The first guiding insert 34, second guiding insert 35 and third guiding insert 36 are coaxially aligned.

As shown in FIG. 6, once the wire threading device 33A has been moved from its home to a threading position, the first wire clamp 26 sits between the first guiding insert 34 and the second guiding insert 35. The second wire clamp 27 sits between the second guiding insert 35 and the third guiding insert 36. The transducer 28 and capillary 29 sit below the third guiding insert 36.

As mentioned above, the aperture extending along the air tensioner body 35 and the capillary 29 are coaxially aligned, as are the apertures extending through the first guiding insert 34, the second guiding insert 35 and the third guiding insert 36. Channels 40 are provided within the wire threading device 33A which couple the first guiding insert 34, the second guiding insert 35 and the third guiding insert 36 with the fittings 38. Air provided through the fittings 38 is conveyed through the channels 40 to the apertures extending through the first guiding insert 34, the second guiding insert 35 and the third guiding insert 36.

In operation, the wire threading device 33A is positioned at the threading position where the apertures extending through the first guiding insert 34, the second guiding insert 35 and the third guiding insert 36 are coaxially aligned with the aperture extending through the air tensioner body 35 and the capillary 29, as will be explained in more detail below.

The section 150A received in the air tensioner opening 24A is conveyed by the air tensioner body 25A towards the first guiding insert 34. The airflow provided through the fittings 38 causes air to be sucked through the first guiding insert 34 which assists in drawing the section 150 into and through the first guiding insert 34, through the first wire clamp 26 and into the second guiding insert 35. Air provided to the second guiding insert 35 causes air to be sucked through the second guiding insert 35 which draws the section 150 into and through the second guiding insert 35 and through the second wire clamp 27 towards the third guiding insert 36. Air provided by the fittings 38 flows through the third guiding insert 36 which draws air through the third guiding insert 36 and draws the section 150 through the capillary 29. Hence, air or suction can be applied so as to force the wire in a guiding direction. A negative pressure can be produced by spraying a gas, the wire is pulled into the guide path by this negative pressure, and the wire that has been pulled in is forcibly fed by the spraying force of the gas. In addition, the wire guiding members can be equipped with a suctioning device that is arranged in the wire guiding direction together with air. In this arrangement, a suction force acts on the wire through the insertion hole of the bonding tool, the wire is suctioned into the insertion hole, and made to protrude from the end of bonding tool. Moreover, some guiding members made not be provided with an air channel feature and only provide a guiding path for the wire.

Positioning Flag

The wire threading device 33A is provided with a positioning flag 37, which helps to align the relative position of the guides of the wire threading device 33A with the air tensioner opening 24A, the aperture within the capillary 29 and the wire clamps 26, 27.

Figure 8A:
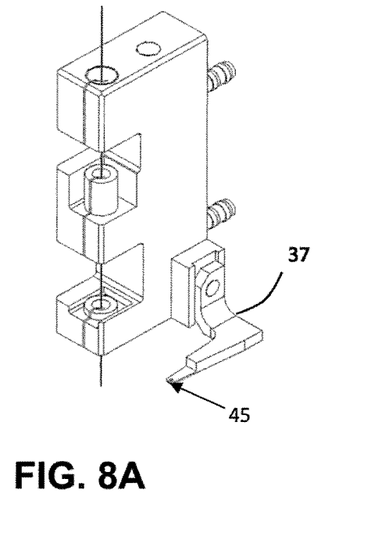
FIG. 8A illustrates imaging a small hole or pattern on the positioning flag.
Figure 8B:
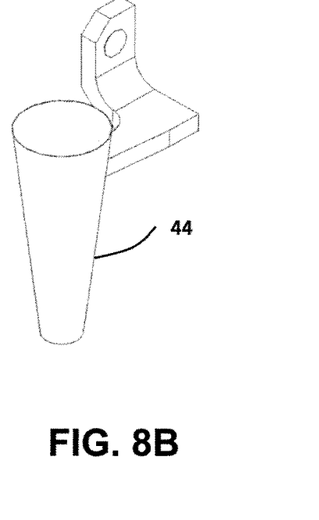
FIG. 8B illustrates shading an area of an optical light path at the threading device.

As can be seen in FIG. 8, there is a small hole or pattern 45 on positioning flag 37 which lets light from the wire bonder optics to go through. Since the positioning flag 37 will shade some area of an optical light path 44, as the shadow of the hole or pattern 45 on positioning flag 37 will show at the optical system's focal length. The optics can then identify the shadow of positioning flag 37 to confirm the actual position of the wire threading device 33A, and furthermore to determine the relative position of the wire threading device 33A and capillary 29 (as well as other components).

Another approach to precisely control the relative position of the wire threading device 33A and capillary 29 (as well as other components) is to use sensors to search for the position of the flag 37, to learn the relative position of wire threading device 33A and capillary 29 (as well as other components). The sensor is fixed on the wire threading device 33A. The locating feature of the flag maintains a fixed position relative to the capillary 29. When the bond head (which contains capillary 29 (as well as other components)) moves towards the wire threading device 33, and as the sensor captures the locating feature on the positioning flag 37, the target threading alignment position can be obtained.

Figure 9A:
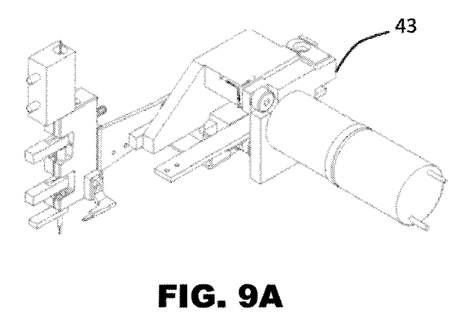
FIG. 9A illustrates operation of an automation motion mechanism.
Figure 9B:
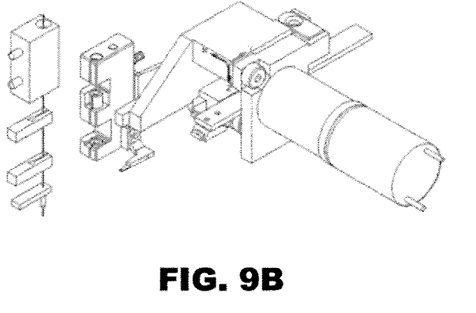
FIG. 9B illustrates the automation mechanism in a parking position.

As can be seen in FIGS. 9A and 9B, the wire threading device 33A has an automation motion mechanism 43, which makes use of mechanical force or pneumatic force to actuate the wire threading device 33A to move forwards and backwards, or rotate around an axis. FIG. 9A shows the wire threading device 33A moved to a working position where the wire threading device 33 is inserted into gaps between the capillary 29, the second wire clamp 27, the first wire clamp 26 and/or the air tensioner body 25. Achieving the correct working position is important, otherwise any misalignment can lead to collision and damage of the capillary 29, the second wire clamp 27, the first wire clamp 26 and the air tensioner body 25. Moreover, if guiding members of the wire threading device 33A are not aligned with holes of the capillary 29, the first wire clamp 26, the second wire clamp 27, and the air tensioner body 25, it will cause failure of threading of the bonding wire. The wire threading device 33A is used to successfully thread the bonding wire through these. As FIG. 9B shows, the wire threading device 33A moves backward to a parking position where the wire threading device 33A is further away from the capillary 29, the second wire clamp 27, the first wire clamp 26 and the air tensioner body 25, and can let the capillary 29, the second wire clamp 27, the first wire clamp 26 and the air tensioner body 25 resume to normal bonding operations.

Slot Sealing

Figure 10A:
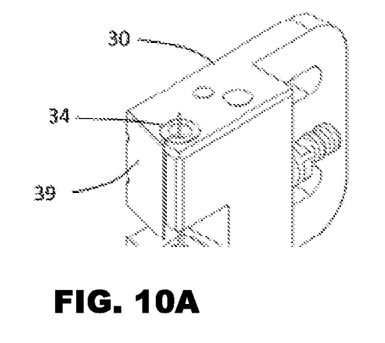
FIG. 10A illustrates the operation of slots and a shim cover to enable the wire threading device move to a parking position.
Figure 10B:
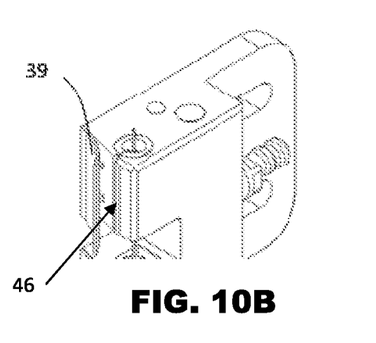
FIG. 10B illustrates movement of the threading device to a parking position.

As shown in FIGS. 10A and 10B, to enable the wire threading device 33A to move to the parking position once the capillary 29, the second wire clamp 27, the first wire clamp 26 and the air tensioner body 25 have been threaded, the wire threading device 33A is provided with a series of slots 46 to enable the bonding wire to separate from the wire threading device 33. One of the methods to have this slot 46 with little adverse effect is to have a soft shim cover 39 over the slot 46 as an open slot reduces the efficiency and effectiveness of the guiding member. Therefore the soft shim cover 39 covers the slot 46 when the wire threading device 33A is threading wire. After the wire has been successfully threaded, the wire threading device 33A will blow air to cause the soft shim cover 39 to bend to open the slot 46 and let the bonding wire leave the wire threading device 33A as it retracts to the parking position.

Figure 11A:
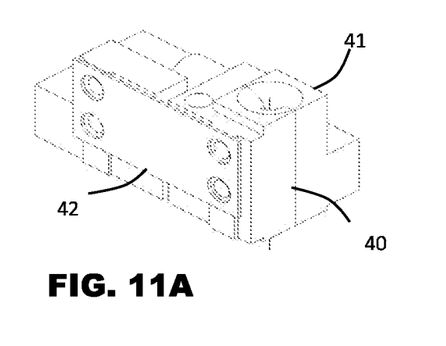
FIG. 11A shows another design to open a slot wherein the threading device and guiding members are replaced by two parts, seen in FIG. 11A.
Figure 11B:
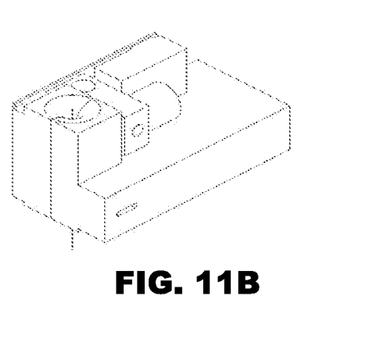
FIG. 11B shows the second of the two parts.

FIGS. 11A and 11B show another design to open the slot. In this design, the wire threading device 33A and guiding members are replaced by two parts, a left guiding part 40 and a right Guiding part 41. Left guiding part 40 and right guiding part 41 are connected by a piece of leaf spring 42 so that, an electromagnetic force, a hydraulic force, and/or a pneumatic force can apply a small force to the left guiding part 40 and let the left guiding part 40 move away from the right guiding part 41 and open a slot to let wire leave and separate from the apparatus.

Hence, it can be seen that the three sub-systems described above provide a systematic solution to retrieve, locate, capture, guide and eventually thread wire through multiple components and the capillary. The auto wire threading apparatus can recover the bonding programme by guiding the wire into the air-path and thread wire through air-tensioner, wire clamp(s), and bonding tool (capillary) in a few seconds. After threading the wire, the auto wire threading system can also prepare a suitable wire tail below the capillary to resume the bonding programme. This auto wire threading apparatus is fully automated, ready for potential industry 4.0 unmanned factory integration. No operator is normally needed to attend to the machine and to manually thread the wire after changing the wire spool or when the bonding wire exits the capillary during bonding.

Although the present invention has been described in considerable detail with reference to certain embodiments, other embodiments are possible.

Therefore, the spirit and scope of the appended claims should not be limited to the description of the embodiments contained herein.

The invention claimed is:

1. A method for automatically threading wire in a wire bonding apparatus, comprising the steps of:
   extending a wire tail of a wire from a wire spool and locating the wire tail in a wire locating device;
   positioning the wire tail at a straightening location of the wire locating device;
   gripping the wire tail at the straightening location with a wire manipulating device;
   straightening the wire tail at the straightening location with the wire manipulating device and conveying the straightened wire tail to a threading location with the wire manipulating device; and
   with a wire threading device, receiving the straightened wire tail at the threading location and threading the straightened wire tail through a capillary of the wire bonding apparatus.

2. The method of claim 1, wherein the wire locating device defines a positioning aperture shaped to receive and guide the wire tail to the wire straightening location.

3. The method of claim 2, wherein the positioning aperture is defined by a pair of converging opposing faces which converge at a positioning face at the straightening location.

4. The method of claim 3, wherein the positioning face extends along a vertical direction to orientate the wire tail along the vertical direction.

5. The method of claim 3, wherein the step of positioning the wire tail at the straightening location further comprises urging the wire tail which extends through the positioning aperture towards the positioning face with a wire tail urging device incorporated in the wire locating device.

6. The method of claim 5, wherein the wire tail urging device comprises an airflow generator which generates an airflow to urge the wire tail extending through the positioning aperture towards the positioning face.

7. The method of claim 6, wherein the airflow generator further retains the wire tail extending through the positioning aperture against the positioning face.

8. The method of claim 1, wherein the wire manipulating device comprises a first and a second pair of wire holders, and the step of gripping the wire tail comprises gripping the wire tail with the first and second pairs of wire holders next to the straightening location.

9. The method of claim 8, wherein the step of straightening the wire tail further comprises the step of moving at least one of the first and second pair of wire holders away from the other while gripping the wire tail to straighten at least a portion of the wire tail.

10. The method of claim 8, further comprising the step of cutting excess wire from a free end of the wire tail to leave the straightened wire tail.

11. The method of claim 8, wherein the step of receiving the straightened wire tail at the threading location further comprises pulling the straightened wire tail to the threading location with at least one of the first and second pair of wire holders.

12. The method of claim 1, further comprising the step of inducing a tension in the wire via an air tensioner while pulling the straightened wire tail to the threading location.

13. The method of claim 1, wherein the step of threading the straightened wire tail through the capillary further comprises the step of moving the wire threading device from a parked position to the threading location which is aligned with the capillary.

14. The method of claim 1, further comprising the step of guiding the straightened wire tail with at least one wire guide comprised in the wire threading device towards the capillary.

15. The method of claim 14, wherein the at least one wire guide comprises a slotted guiding channel having an elongate slot extending along its axial length aligned with an air tensioner and the capillary.

16. The method of claim 15, wherein the wire guide comprises a slot restrictor operative in use to close the slot.

17. The method of claim 16, wherein the slot restrictor comprises a flexible cover operative in use to move between a closed and an open position to close and open the slot.

18. The method of claim 17, further comprising the step of generating an airflow within the wire guide to move the flexible cover between the closed and open positions.

19. The method of claim 16, wherein the slot restrictor comprises a spring coupling a first half of the wire guide with a second half of the wire guide and operative in use to move between a closed and an open position to close and open the slot.

20. The method of claim 1, further comprising the step of obtaining information regarding a location of the wire guide with respect to the capillary by imaging a positioning identifier coupled to the wire threading device.

21. The method of claim 20, wherein the positioning identifier comprises a visual index operative in use to be imaged by a wire bonding imaging device.

22. The method of claim 1, further comprising the step of aligning the wire guide with the capillary by positioning the wire guide with a motion table and controller.

23. A system for automatically threading wire in a wire bonding apparatus, the system comprising:
 a wire locating device configured to receive a wire tail of a wire extended from a wire spool and position the wire tail at a straightening location of the wire locating device;
 a wire manipulating device configured and operative to grip the wire tail at the straightening location, to straighten the wire tail at the straightening location and to convey the straightened wire tail to a threading location; and
 a wire threading device configured to receive the straightened wire tail at the threading location and to thread the straightened wire tail through a capillary of the wire bonding apparatus.

* * * * *